(12) United States Patent
Reeves et al.

(10) Patent No.: US 8,647,705 B2
(45) Date of Patent: Feb. 11, 2014

(54) METHODS FOR FORMING SUPERCONDUCTOR ARTICLES AND XRD METHODS FOR CHARACTERIZING SAME

(75) Inventors: Jodi Lynn Reeves, Guilderland, NY (US); David M. Gibson, Voorheesville, NY (US); Walter M. Gibson, Voorheesville, NY (US); Huapeng Huang, Latham, NY (US)

(73) Assignee: SuperPower, Inc., Schenectady, NY (US)

( * ) Notice: Subject to any disclaimer, the term of this patent is extended or adjusted under 35 U.S.C. 154(b) by 0 days.

(21) Appl. No.: 13/466,037

(22) Filed: May 7, 2012

(65) Prior Publication Data

US 2013/0150247 A1    Jun. 13, 2013

Related U.S. Application Data

(63) Continuation of application No. 10/892,731, filed on Jul. 16, 2004, now abandoned.

(60) Provisional application No. 60/487,739, filed on Jul. 16, 2003.

(51) Int. Cl.
  *B05D 5/12* (2006.01)
(52) U.S. Cl.
  USPC .......................................................... 427/62
(58) Field of Classification Search
  USPC .......................................................... 427/62
  See application file for complete search history.

(56) References Cited

U.S. PATENT DOCUMENTS

| | | | |
|---|---|---|---|
| 4,078,175 A | 3/1978 | Fletcher et al. | |
| 4,649,556 A | 3/1987 | Rinik et al. | |
| 4,715,053 A | 12/1987 | Comstock et al. | |
| 5,046,077 A * | 9/1991 | Murayama | 378/80 |
| 5,426,092 A | 6/1995 | Ovshinsky et al. | |
| 5,470,668 A | 11/1995 | Wu et al. | |
| 5,739,086 A | 4/1998 | Goyal et al. | |
| 5,898,020 A | 4/1999 | Goyal et al. | |
| 5,968,877 A * | 10/1999 | Budai et al. | 505/237 |
| 5,982,034 A | 11/1999 | Cava et al. | |
| 6,269,144 B1 * | 7/2001 | Dube et al. | 378/71 |
| 6,301,330 B1 * | 10/2001 | Kurtz et al. | 378/71 |
| 6,555,256 B1 * | 4/2003 | Christen et al. | 428/697 |
| 6,665,372 B2 | 12/2003 | Bahr et al. | |
| 6,882,739 B2 * | 4/2005 | Kurtz et al. | 382/109 |

(Continued)

OTHER PUBLICATIONS

Specht et al., "Uniform texture in meter long YBa2Cu3O7 tape", Physica C 382 (2002) pp. 342-348—no month available.*

(Continued)

*Primary Examiner* — Brian K Talbot
(74) *Attorney, Agent, or Firm* — Abel Law Group, LLP

(57) ABSTRACT

A method for forming a superconductive article is disclosed. According to one method, a substrate is provided, the substrate having an aspect ratio of not less than about $1 \times 10^3$, forming a buffer layer overlying the substrate, forming a superconductor layer overlying the buffer layer, and characterizing at least one of the substrate, the buffer layer and the superconductor layer by x-ray diffraction. In this regard, x-ray diffraction is carried out such that data are taken at multiple phi angles. Data acquisition at multiple phi angles permits robust characterization of the film or layer subject to characterization, and such data may be utilized for process control and/or quality control. Additional methods for forming superconductive articles, and for characterizing same with XRD are also disclosed.

20 Claims, 14 Drawing Sheets

(56) References Cited

U.S. PATENT DOCUMENTS

| | | | |
|---|---|---|---|
| 7,236,566 B2 * | 6/2007 | Gibson et al. | 378/71 |
| 7,711,088 B2 * | 5/2010 | Gibson et al. | 378/71 |
| 2003/0021885 A1 | 1/2003 | Shoup et al. | |
| 2004/0016401 A1 | 1/2004 | Ignatiev et al. | |
| 2004/0096587 A1 | 5/2004 | Sambasivan et al. | |
| 2004/0168636 A1 | 9/2004 | Savvides et al. | |

OTHER PUBLICATIONS

J. Egly, et al., "YBa2Cu3O7—Deposition on Metal Tape Substrates", EUCAS '99, Sitges, Spain, 13.17.9.1999.

* cited by examiner

METHODS FOR FORMING SUPERCONDUCTOR ARTICLES AND XRD METHODS FOR CHARACTERIZING SAME

CROSS-REFERENCE TO RELATED APPLICATION(S)

The present application is a continuation of U.S. patent application Ser. No. 10/892,731, filed Jul. 16, 2004, which claims priority from U.S. Provisional Patent Application No. 60/487,739, filed Jul. 16, 2003, both entitled "METHODS FOR FORMING SUPERCONDUCTOR ARTICLES AND XRD METHODS FOR CHARACTERIZING SAME," naming inventors Jodi Lynn Reeves et al., which application is incorporated by reference herein in its entirety.

BACKGROUND

1. Field of the Invention

The present invention is generally directed to superconductor articles, and methods for forming and characterizing same.

2. Description of the Related Art

Superconductor materials have long been known and understood by the technical community. Low-temperature (low-$T_c$) superconductors exhibiting superconductive properties at temperatures requiring use of liquid helium (4.2° K), have been known since about 1911. However, it was not until somewhat recently that oxide-based high-temperature (high-$T_c$) superconductors have been discovered. Around 1986, a first high-temperature superconductor (HTS), having superconductive properties at a temperature above that of liquid nitrogen (77° K) was discovered, namely $YBa_2Cu_3O_{7-x}$, (YBCO), followed by development of additional materials over the past 15 years including $Bi_2Sr_2Ca_2Cu_3O_{10+y}$ (BSCCO), and others. The development of high-$T_c$ superconductors has brought potential, economically feasible development of superconductor components incorporating such materials, due partly to the cost of operating such superconductors with liquid nitrogen, rather than the comparatively more expensive cryogenic infrastructure based on liquid helium.

Of the myriad of potential applications, the industry has sought to develop use of such materials in the power industry, including applications for power generation, transmission, distribution, and storage. In this regard, it is estimated that the native resistance of copper-based commercial power components is responsible for quite significant losses in electricity, and accordingly, the power industry stands to gain significant efficiencies based upon utilization of high-temperature superconductors in power components such as transmission and distribution power cables, generators, transformers, and fault current interrupters. In addition, other benefits of high-temperature superconductors in the power industry include an increase in one to two orders of magnitude of power-handling capacity, significant reduction in the size (i.e., footprint) of electric power equipment, reduced environmental impact, greater safety, and increased capacity over conventional technology. While such potential benefits of high-temperature superconductors remain quite compelling, numerous technical challenges continue to exist in the production and commercialization of high-temperature superconductors on a large scale.

Among the many challenges associated with the commercialization of high-temperature superconductors, many exist around the fabrication of a superconducting tape that can be utilized for formation of various power components. A first generation of superconducting tapes includes use of the above-mentioned BSCCO high-temperature superconductor. This material is generally provided in the form of discrete filaments, which are embedded in a matrix of noble metal, typically silver. Although such conductors may be made in extended lengths needed for implementation into the power industry (such as on the order of kilometers), due to materials and manufacturing costs, such tapes do not represent a commercially feasible product.

Accordingly, a great deal of interest has been generated in the so-called second-generation HTS tapes that have superior commercial viability. These tapes typically rely on a layered structure, generally including a flexible substrate that provides mechanical support, at least one buffer layer overlying the substrate, the buffer layer optionally containing multiple films, an HTS layer overlying the buffer film, and an electrical stabilizer layer overlying the superconductor layer, typically formed of at least a noble metal. However, to date, numerous engineering and manufacturing challenges remain prior to full commercialization of such second generation-tapes.

Accordingly, in view of the foregoing, various needs continue to exist in the art of superconductors, and in particular, provision of commercially viable superconducting tapes, methods for forming and characterizing same, and power components utilizing such superconducting tapes.

SUMMARY

According to one aspect of the present invention, a method for forming a superconductive article is provided, which includes the steps of providing a substrate, forming a buffer layer overlying the substrate, and forming a superconductor layer overlying the buffer layer. According to one particular feature, the substrate has a relatively high aspect ratio, such as not less than about $1 \times 10^3$. Further, the method calls for a step of characterizing at least one of the substrate, the buffer layer, and the superconductor layer by x-ray diffraction, where x-ray diffraction data are taken at multiple phi angles. Typically, at least three distinct phi angles are utilized during characterization, more typically, at least four unique phi angles.

According to another aspect of the present invention, a method for characterizing the superconductive article is provided, which includes providing a superconductive article, and executing a characterizing step. The superconductive article includes a substrate, the substrate having an aspect ratio of not less than about $1 \times 10^3$, a buffer layer, and a superconductor layer. The characterizing step includes characterizing at least one of the substrate, the buffer layer, and the superconductor layer by x-ray diffraction, wherein x-ray diffraction data are taken at multiple phi angles.

According to another aspect of the present invention, a method for forming a superconductive article is provided, which includes providing a substrate, the substrate having an aspect ratio of not less than about $1 \times 10^3$ and having a non-textured crystal structure. Further, the method calls for forming a buffer layer overlying the substrate, the buffer layer including a biaxially textured film, forming a superconductor layer overlying the buffer layer, and characterizing at least one of the buffer layer and the superconductor layer by x-ray diffraction.

According to yet another aspect of the present invention, a method for forming a superconductive article is provided, including the steps of providing a substrate, forming a buffer layer overlying the substrate, forming a superconductor layer overlying the buffer layer, and characterizing at least one of the substrate, the buffer layer, and the superconductor layer by x-ray diffraction, utilizing an x-ray source having a parallel x-ray beam.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
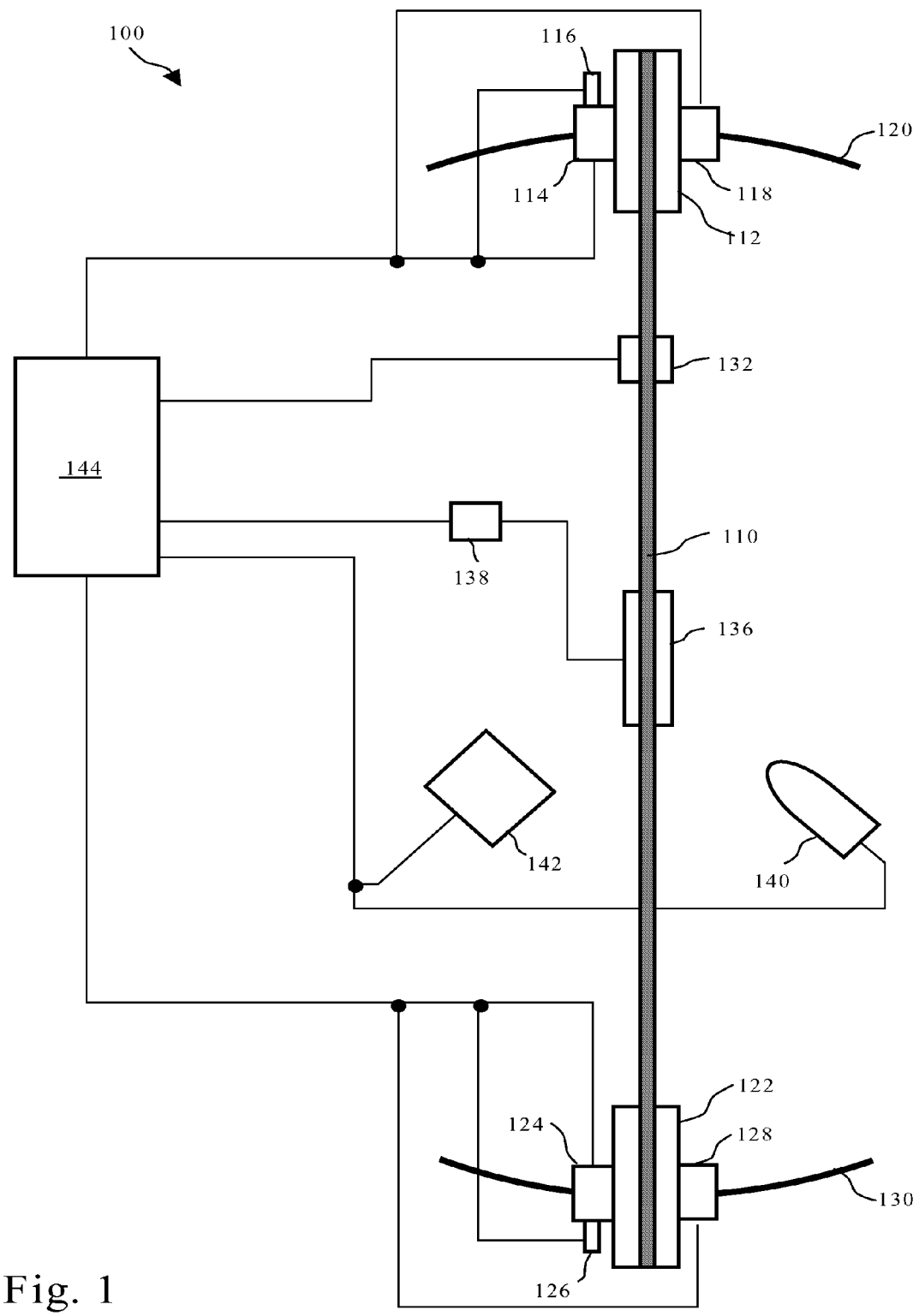
FIG. 1 shows a block diagram of an XRD system for determining the crystallographic texture of a reel-to-reel spool-fed continuous tape.

FIG. 1 shows an XRD system 100 for determining the crystallographic texture of a reel-to-reel spool-fed continuous sample in the form of an HTS (high temperature superconductor) tape 110. The tape includes a substrate portion on which processing takes place to form a finished HTS conductor. Particularly suitable substrate materials for include nickel-based metal alloys such as the known Inconel® and Hasteloy® groups of alloys. Such alloys tend to have desirable thermal, chemical and mechanical properties, including coefficient of expansion, thermal conductivity, Curie temperature, tensile strength, yield strength, and elongation. These alloys are generally commercially available in the form of spooled tapes, particularly suitable for HTS tape fabrication, which typically will utilize reel-to-reel tape handling.

The substrate is typically in a tape-like configuration, having a high aspect ratio. For example, the width of the tape is generally on the order of about 0.4-10 cm, and the length of the tape is typically at least about 100 m, most typically greater than about 500 m. Indeed, embodiments of the present invention provide for superconducting tapes that include a substrate having a length on the order of 1 km or above. Accordingly, the substrate may have an aspect ratio that is fairly high, on the order of not less than $10^3$, or even not less than $10^4$. Certain embodiments are longer, having an aspect ratio of $10^5$ and higher. As used herein, the term 'aspect ratio' is used to denote the ratio of the length of the substrate or tape to the next longest dimension, the width of the substrate or tape.

In one embodiment, the substrate is treated so as to have desirable surface properties for subsequent deposition of the constituent layers of the HTS tape. For example, the surface may be lightly polished to a desired flatness and surface roughness. The substrate may be treated to be biaxially textured as is understood in the art, such as by the known RABiTS (rolling assisted biaxially textured substrate) technique, although particular embodiments focus on use of non-textured, polycrystalline alloy substrates.

Typically, the tape 110 is processed to include a buffer layer, which functions to isolate the substrate portion from an overlying superconducting layer. The buffer layer may be a single layer, or more commonly, be made up of several films. Most typically, the buffer layer includes a biaxially textured film, having a crystalline texture that is generally aligned along crystal axes both in-plane and out-of-plane of the film. Such biaxial texturing may be accomplished by IBAD. As is understood in the art, IBAD is acronym that stands for ion beam assisted deposition, a technique that may be advantageously utilized to form a suitably textured buffer layer for subsequent formation of an HTS layer having desirable crystallographic orientation for superior superconducting properties. YSZ (yttria stabilized zirconia) and magnesium oxide are typical materials of choice for the IBAD film, and may be on the order or 50 to 500 Angstroms, such as 50 to 200 Angstroms in thickness. Generally, the IBAD film has a rock-salt like crystal structure, as defined and described in U.S. Pat. No. 6,190,752.

In embodiments utilizing an MgO-based IBAD film and/or epitaxial film, a lattice mismatch between the MgO material and the material of the superconductor layer exists. Accordingly, the buffer layer may further include another buffer film, this one in particular implemented to reduce a mismatch in lattice constants between the HTS layer and the underlying IBAD film and/or epitaxial film. This buffer film may be formed of materials such as YSZ (yttria-stabilized zirconia) strontium ruthenate, lanthanum manganate, and generally, perovskite-structured ceramic materials. The buffer film may be deposited by various physical vapor deposition techniques.

While the foregoing has principally focused on implementation of a biaxially textured film in the buffer stack (layer) by a texturing process such as IBAD, alternatively, in one embodiment, the substrate surface itself may be biaxially textured. In this case, the buffer layer is generally epitaxially grown on the textured substrate so as to preserve biaxial texturing in the substrate. One process for forming a biaxially textured substrate is the process known in the art as RABiTS (roll assisted biaxially textured substrates), generally understood in the art.

The high-temperature superconductor (HTS) layer is provided to overlie the buffer layer, and is typically chosen from any of the high-temperature superconducting materials that exhibit superconducting properties above the temperature of liquid nitrogen, 77K. Such materials may include, for example, $YBa_2Cu_3O_{7-x}$, $Bi_2Sr_2Ca_2Cu_3O_{10+y}$, $Tl_2Ba_2Ca_2Cu_3O_{10+y}$, and $HgBa_2Ca_2Cu_3O_{8+y}$. One class of materials includes $REBa_2Cu_3O_{7-x}$, wherein RE is a rare earth element. Of the foregoing, $YBa_2Cu_3O_{7-x}$, also generally referred to as YBCO, may be advantageously utilized. The HTS layer may be formed by any one of various techniques, including thick and thin film forming techniques. Preferably, a thin film physical vapor deposition technique such as pulsed laser deposition (PLD) can be used for a high deposition rates, or a chemical vapor deposition technique can be used for lower cost and larger surface area treatment. Typically, the HTS layer has a thickness on the order of about 1 to about 30 microns, most typically about 2 to about 20 microns, such as about 2 to about 10 microns, in order to get desirable amperage ratings associated with the HTS layer.

Following deposition of a superconducting layer, typically at least one conductive shunting layer is deposited in order to prevent damage to the superconducting layer as deployed in power-related applications, including power cables (including distribution and transmission power cables), power generator, and transformers. The details of the conductive shunt layer and the various components in which the finished HTS tape can be implemented are provided in co-owned U.S. patent application Ser. No. 10/607,945, filed Jun. 27, 2003, to Lee et al., incorporated herein by reference.

Turning back to FIG. 1, the tape 110 unwinds from a payout spool 112 and winds onto a take-up spool 122 in reel-to-reel fashion, threading through a sample holder 136 and making physical contact with an encoder 132 or a tape location reader. The encoder 132 provides position tracking and also provides a way to monitor the translation rate of the tape 110 as it translates through the XRD system 100. The encoder 132 can be of multiple types, such as a #9120S-04096F-5L01-A48SP-04EN model manufactured by Gurley Precision Instruments (Troy, N.Y.). An alternate way to provide position tracking is to use a tape location reader that utilizes a bar code or dot matrix read head to measure and communicate the exact distance along the length of the tape 110 at which measurements are being performed. The tape location reader may additionally provide information identifying the sample, i.e., the specifics of the tape 110 processing history. Additional details are provided in U.S. patent application Ser. No. 10/614,400, filed Jul. 3, 2003 to Knoll et al, incorporated herein by reference.

Figure 2:
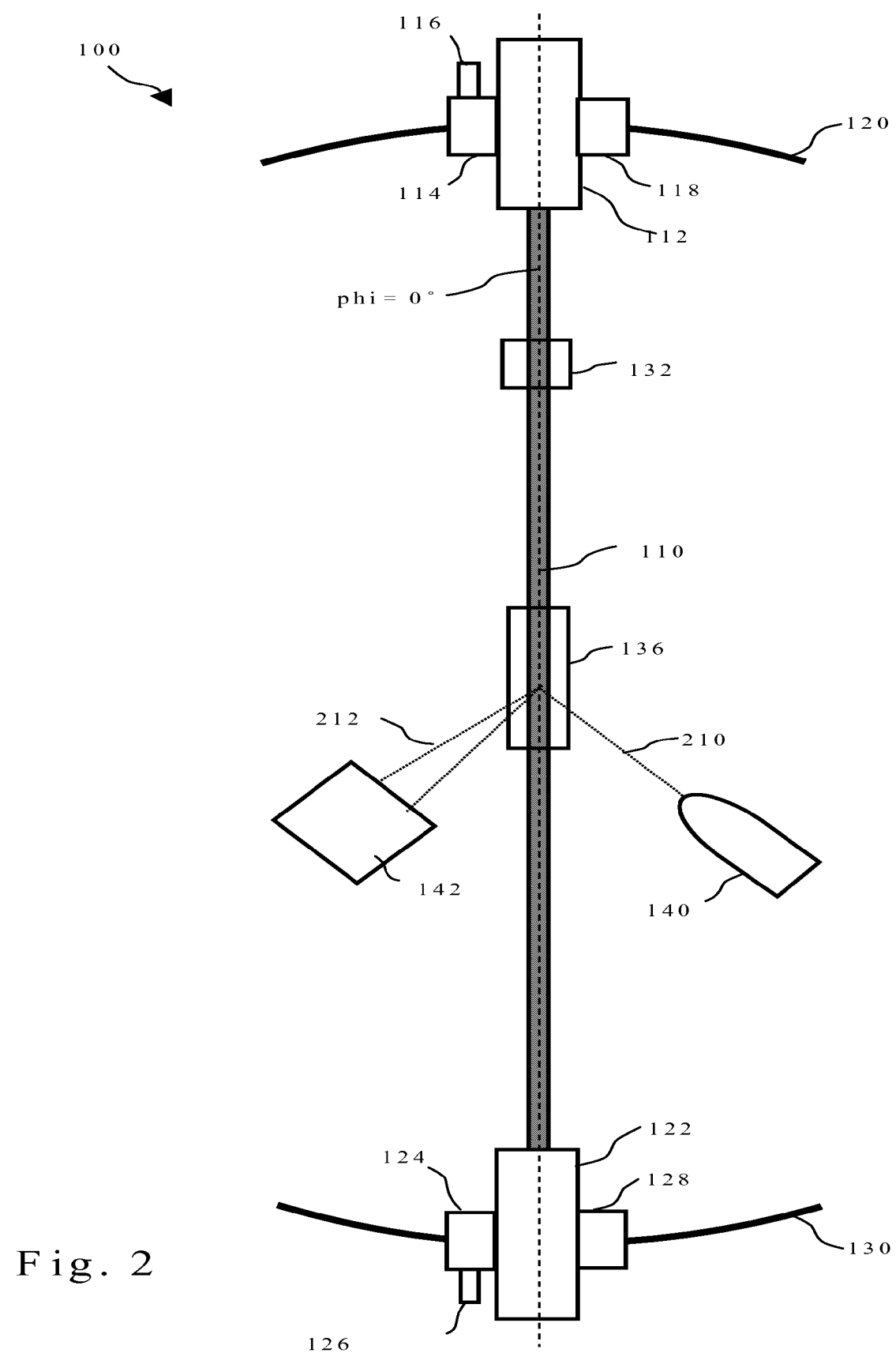
FIG. 2 shows a block diagram of the XRD system with elements oriented at a φ-angle of zero.
Figure 3:
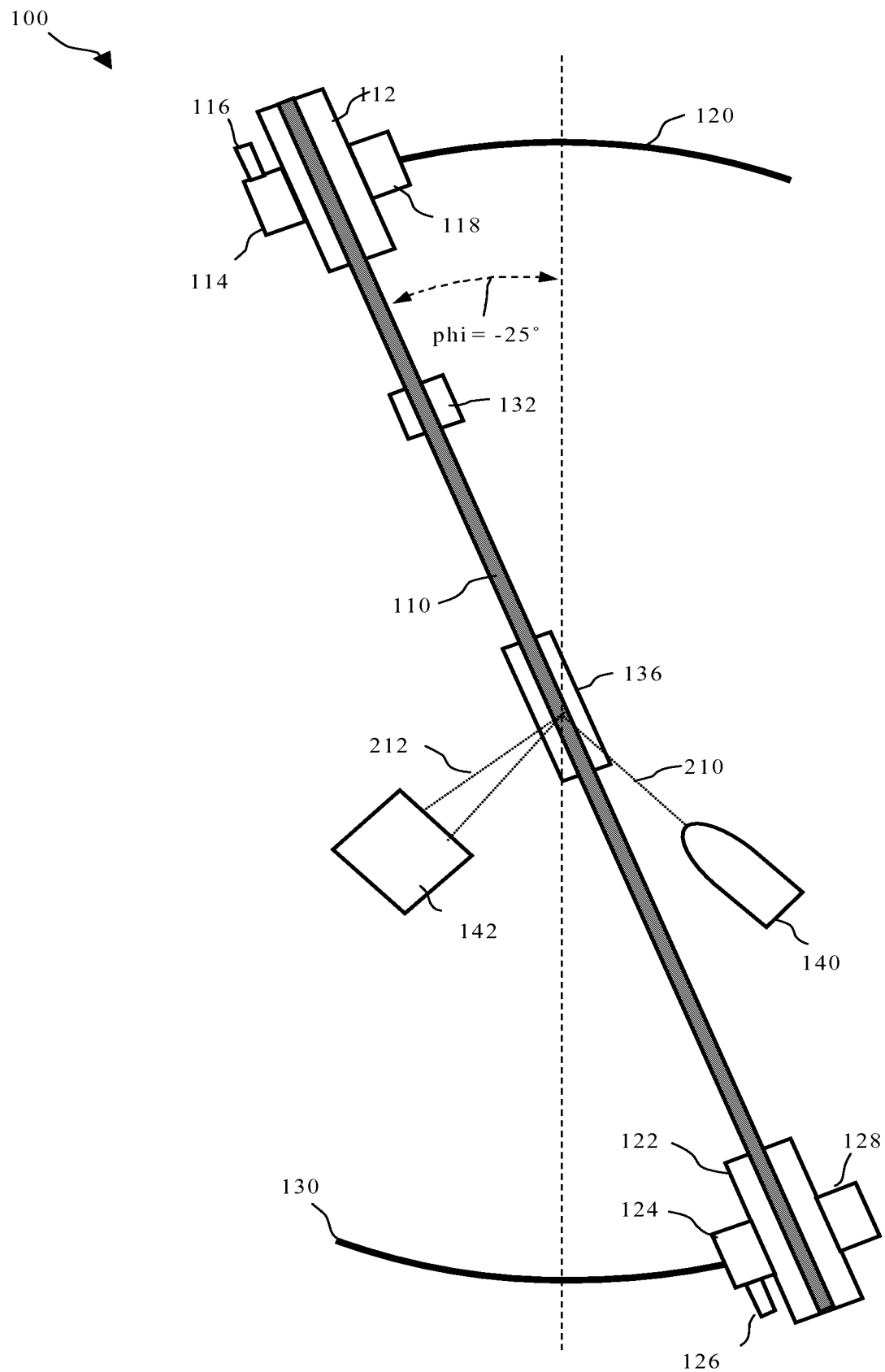
FIG. 3 shows a block diagram of the XRD system with elements oriented at a φ-angle of −25°.
Figure 4:
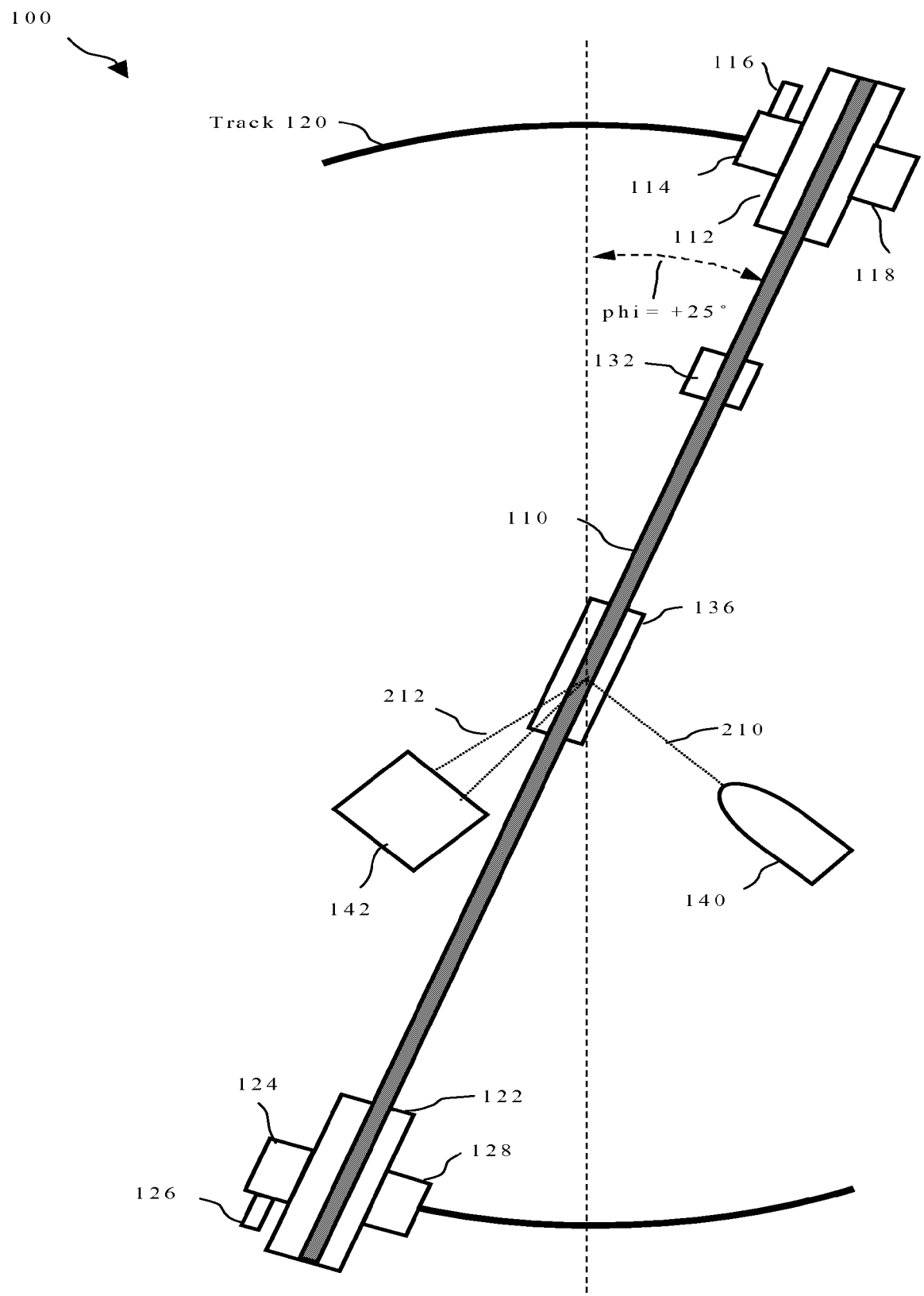
FIG. 4 shows a block diagram of the XRD system with elements oriented at a φ-angle of +25°.

The payout spool 112 and the take-up spool 122 are functionally connected to a track 120 and a track 130, respectively, such that the payout spool 112 and the take-up spool 122 are capable of a range of $\phi$-angle displacements, such as between −25 and 25 degrees, as illustrated in FIGS. 3 and 4. The track 120 and the track 130 may be linear bearing tracks, such as are commercially available from vendors such as Thomson Industries. A motor 114 such as a stepper motor drives the rotation of the payout spool 112 and hence advances the tape 110 through the XRD system 100 a desirable increment while a motor 124 such as a torque motor drives the rotation of the take-up spool 122 and thereby provides a desirable amount of tension in the tape 110. A motor 118 such as a stepper motor controls the placement of the payout spool 112 along the track 120, while a similar motor 128 works opposite to the motor 118 to control the placement of the take-up spool 122 along the track 130, as is illustrated in FIGS. 2, 3, and 4. A similar motor 116, such as a stepper motor, tilts the payout spool 112 an appropriate amount in response to the angle through which the motor 118 angles the payout spool 112 along the track 120, such that twists do not develop in the tape 110 that may occur were the payout spool 112 to remain vertical throughout the movement of the payout spool 112 along the track 120. Similarly, a motor 126 angles the take-up spool 122 an appropriate amount in response to the angle through which the motor 128 angles the take-up spool 122 along the track 130. The motors 114, 116, and 118 and the motors 124, 126, and 128 are commercially available from Oriental Motors.

An x-ray source 140 and an area detector 142 comprise a general area detector diffraction system (GADDS), such as is commercially available from Bruker AXS Ltd., which is adapted for reel-to-reel, continuous sample lengths by the replacement of its stage with the sample holder 136. The x-ray source 140 that focuses a parallel incident beam 210 of x-ray radiation, such as copper K$\alpha$ radiation, onto the tape 110, as shown in FIG. 2. For characterization of biaxially textured thin layers or films according to embodiments of the present invention, use an x-ray source that generates parallel x-ray incident beams is desirable. In this regard, use of an x-ray source generating a parallel x-ray incident beam advantageously improves the integrity of the data measured through characterization, as compared to techniques which utilize divergent beams for characterization. More specifically, the precise position of the tape as it translates through the characterization zone, most notably, in the z-direction, affects the precision of the x-ray measurement when relying on systems incorporating divergent beams. In contrast, use of a parallel beam minimizes the affect a variance in the actual z-direction location of the tape undergoing characterization.

The x-ray source 140 and the area detector 142 are oriented within the XRD system 100 such that the incident beam 210 impinges upon the tape 110 at an given angle and produces a diffracted beam 212 also at a given angle to the surface of the tape 110. In the case of YSZ, that angle is typically about 15°, which corresponds to a $\phi$ (phi) angle of 0 degrees. Of course, for different materials, the incident and diffracted beam angles may be at different angles, as the particular physical angles are generally material dependent. The XRD system 100 can be used for a variety of sampling materials by setting the incident angle and the detector angle differently, typically corresponding to a 0 degree $\phi$ angle. A goniometer (not shown) is included in the GADDS that is functionally connected to the sample holder 136 and enables movement of the sample holder 136 through a plurality of motions and angles, including rotation through a range of $\phi$-angles in conjunction with the positioning of the payout spool 112 and the take-up spool 122 on the track 120 and the track 130, respectively. Optionally, the GADDS system includes laser-positioning functionality for sample height calibration.

Figure 5:
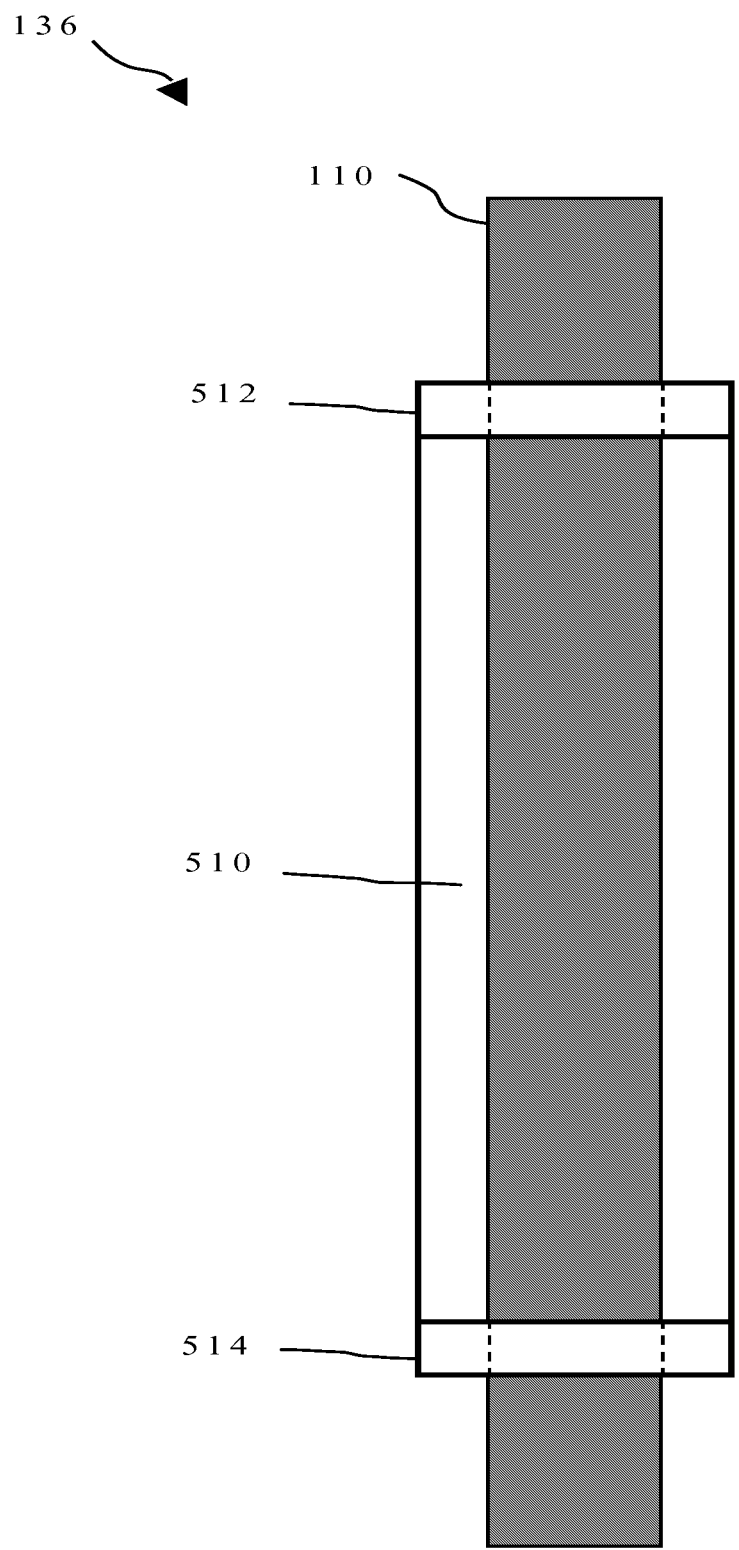
FIG. 5 shows a top view of a sample holder used in the XRD system.
Figure 6A:
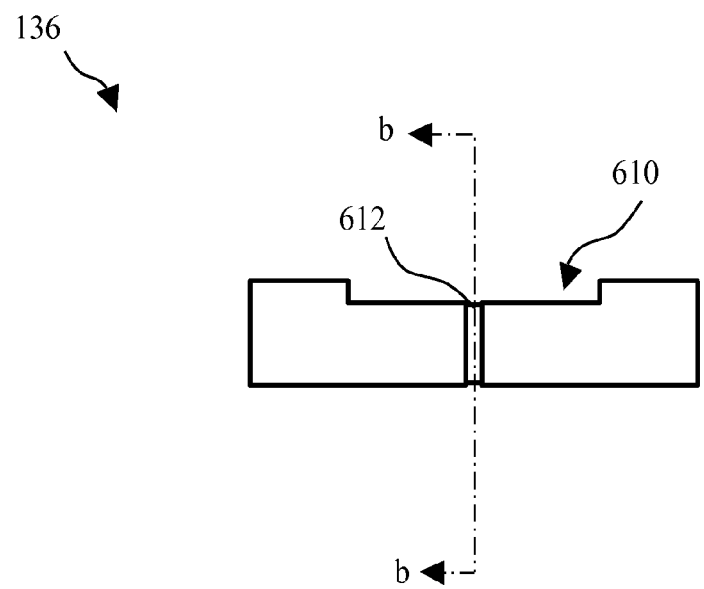
FIG. 6A shows an end view of the sample holder of FIG. 5.
Figure 6B:
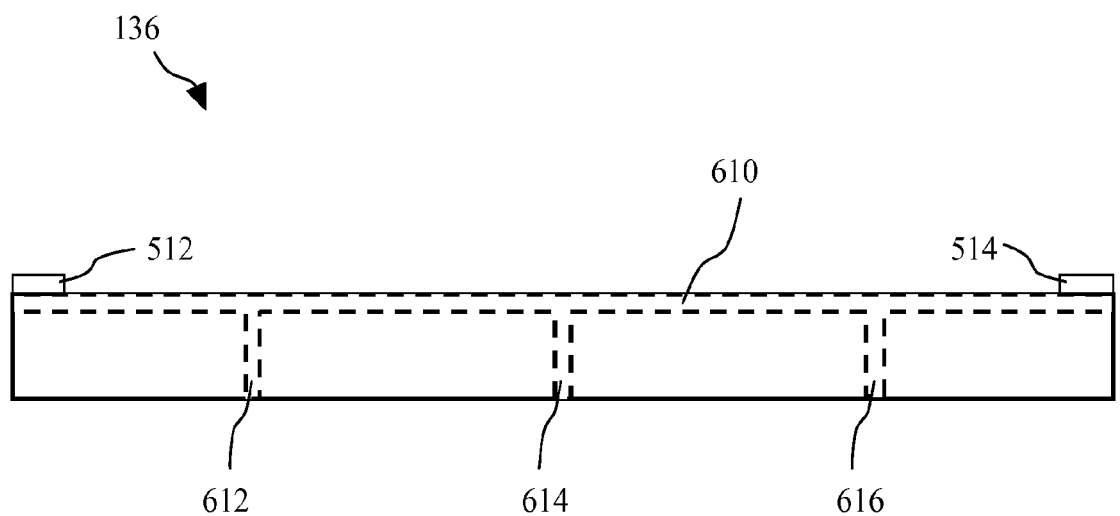
FIG. 6B shows a side view of the sample holder of FIG. 5.

As shown in FIGS. 1-4, and in greater detail in FIGS. 5, 6A, and 6B, the sample holder 136 includes a base plate 510 to which are attached a guide 512 at one end and a guide 514 at the opposing end. The base plate 510 is composed of a metal such as stainless steel and includes a groove 610 through the surface of the base plate 510 that accommodates the tape 110. If the tape 110 is one centimeter wide and two to four thousandths of an inch thick, the groove 610 measures slightly over one centimeter wide and approximately two to four thousandths of an inch deep. Further included in the sample holder 136 is a vacuum port 612, a vacuum port 614, and a vacuum port 616, which are holes machined through the body of the sample holder 136 terminating at the groove 610 that are connected to a pump 138. The pump 138 is a low power pump, such as a roughing pump or a diaphragm pump, and is commercially available from McMaster-Carr. While FIGS. 6A and 6B show the sample holder 136 to include three vacuum ports 612, 614, and 616, the illustrated embodiment is not limited to a specific number of vacuum ports. Due to the presence of vacuum ports 612, 614, and 616, the sample holder 136 serves as a vacuum chuck for pulling the tape 110 flat against the surface of the sample holder 136 within the groove 610 during measurement intervals. The guides 512 and 514 are generally composed of nonabrasive material such as plastic or Plexiglas and serve to guide the feeding of the tape 110 into the sample holder 136.

A controller 144 is in communication with the motors 114, 116, 118, 124, 126, and 128; the encoder 132; the pump 138;

the x-ray source 140; and the area detector 142. The controller 144 mathematically interprets the diffraction patterns created at the area detector 142, yielding quantitative information about the texture of the layer of tape 110 subjected to characterization, which may include the substrate itself in the case of a textured substrate, but most often will be at least one film of the buffer layer and/or the superconductor (HTS) layer. The graphs produced by the controller 144 are coordinated with sample-identifying information as communicated to the controller 144 by the encoder 132. The final output of the controller 144 is in-plane texture (not just intensity) as a function of position along the tape 110, as is described in reference to FIG. 7 and FIG. 8, discussed in more detail below. The controller 144 may be embodied as a system personal computer (PC), data acquisition software for the GADDS system, control software such as LabView, and a set of interfacing components.

In operation, the tape 110, either in the form of a uncoated substrate, but more typically in the form of a substrate coated with a buffer layer and/or a superconductor layer as described above, is then subjected to characterization at XRD system 100 to undergo texture analysis, and most typically, in-plane texture analysis. While the precise form of the embodiment shown in FIG. 1 is readily adaptable for characterization ex-situ, it may be used in-situ as well, discussed in more detail with other embodiments herein.

The tape 110 is manually threaded from the payout spool 112 through the guides 512 and 514 on the sample holder 136 and onto the take-up spool 122. The encoder 132 is made to physically contact the tape 110. The controller 144 next advances the tape 110 through the XRD system 100 by driving the motor 114 and the motor 124, which drive the rotation of the payout spool 112 and the take-up spool 122, respectively. The encoder 132 measures the distance translated by the tape 110 and at a predetermined increment, e.g., every 10 centimeters, as programmed within the controller 144, the controller 144 halts the translation of the tape 110 through the XRD system 100 by disengaging the motors 114 and 124. The controller 144 engages the pump 138, creating a vacuum through the vacuum ports 612, 614, and 616 that adheres the tape 110 flatly within the groove 610 of the base plate 510 of the sample holder 136 and maintains the tape 110 at a fixed vertical height. The controller 144 begins the texture analysis by communicating to the x-ray source 140 to emit the incident beam 210, which impinges upon the tape 110 at an appropriate angle, e.g., 15° for YSZ or 16.4° for a YBCO HTS layer, and produces the diffracted beam 212, which is collected at the area detector 142 and creates a diffraction pattern that is communicated back to the controller 144. Data is collected by the area detector 142 for a time interval of, for example, 10 seconds, after which time the controller 144 communicates to the x-ray source 140 to discontinue generation of the incident beam 210. The controller 144 then engages the motor 118 and the motor 128, which advance the payout spool 112 and the take-up spool 122 through an appropriate φ-angle, e.g., 5°, along the track 120 and the track 130, respectively. During the advancement of the payout spool 112 and the take-up spool 122 along the track 120 and the track 130, the motor 116 and the motor 126 are also engaged by the controller 144 to tilt the orientation of the payout spool 112 and the take-up spool 122 an appropriate angle from the vertical to properly align the payout spool 112 and the take-up spool 122 with the φ-angle through which the payout spool 112 and the take-up spool 122 have advanced along the track 120 and the track 130, respectively. Also in conjunction with the advancement of the payout spool 112 and the take-up spool 122 along the track 120 and the track 130, respectively, the controller 144 rotates the sample holder 136 an appropriate amount by communicating with the goniometer to which the sample holder 136 is functionally attached. The encoder 132 remains in functional contact with the tape 110 throughout its range of φ-motion. Once the payout spool 112 and the take-up spool 122 have advanced through an appropriate φ-angle along the tracks 120 and 130, respectively, the controller 144 disengages the motors 116, 118, 126, and 128, and reengages the pump 138. The controller 144 communicates to the x-ray source 140 to emit the incident beam 210, and data is again collected at the area detector 142 and communicated to the controller 144 for a similar time interval. The process continues until data has been collected at various phi angles through a range of phi angles. Typically, data is taken at multiple phi angles, usually at least 3, more typically at least 4, and generally within a range of about 5 to 25 angles, more typically about 8 to 15 angles. In one embodiment, a range of φ-angles, e.g., at increments of 5° from −25° to 25°, as shown in FIGS. 3 and 4. During the data collection through the range of φ-angles, the x-ray source 140 and the area detector 142 remain stationary. An important aspect, however is that the tape and the source/detector are moved through different phi angles, the significance of which is discussed below, such that one of the source/detector and the tape, or both can be repositioned for different phi angle data acquisition.

The tape 110 is then brought back to a φ-angle of 0°, as shown in FIG. 2, by the appropriate positioning and orientation of the payout spool 112 along the track 120 by the motor 118 and the motor 116 and the appropriate positioning and orientation of the take-up spool 122 along the track 130 by the motor 128 and the motor 126, respectively. The motor 114 and the motor 124 are reengaged by the controller 144 and advance the tape 110 another increment, e.g., 10 cm, through the XRD system 100 and the measurement process is repeated, such that data collected by the controller 144 can be plotted as a function of distance along the tape 110, as is described with respect to FIG. 7 and FIG. 8. The encoder 132 communicates to the controller 144 distance information for the tape 110 that gets paired with the gathered x-ray texture data.

Figure 7:
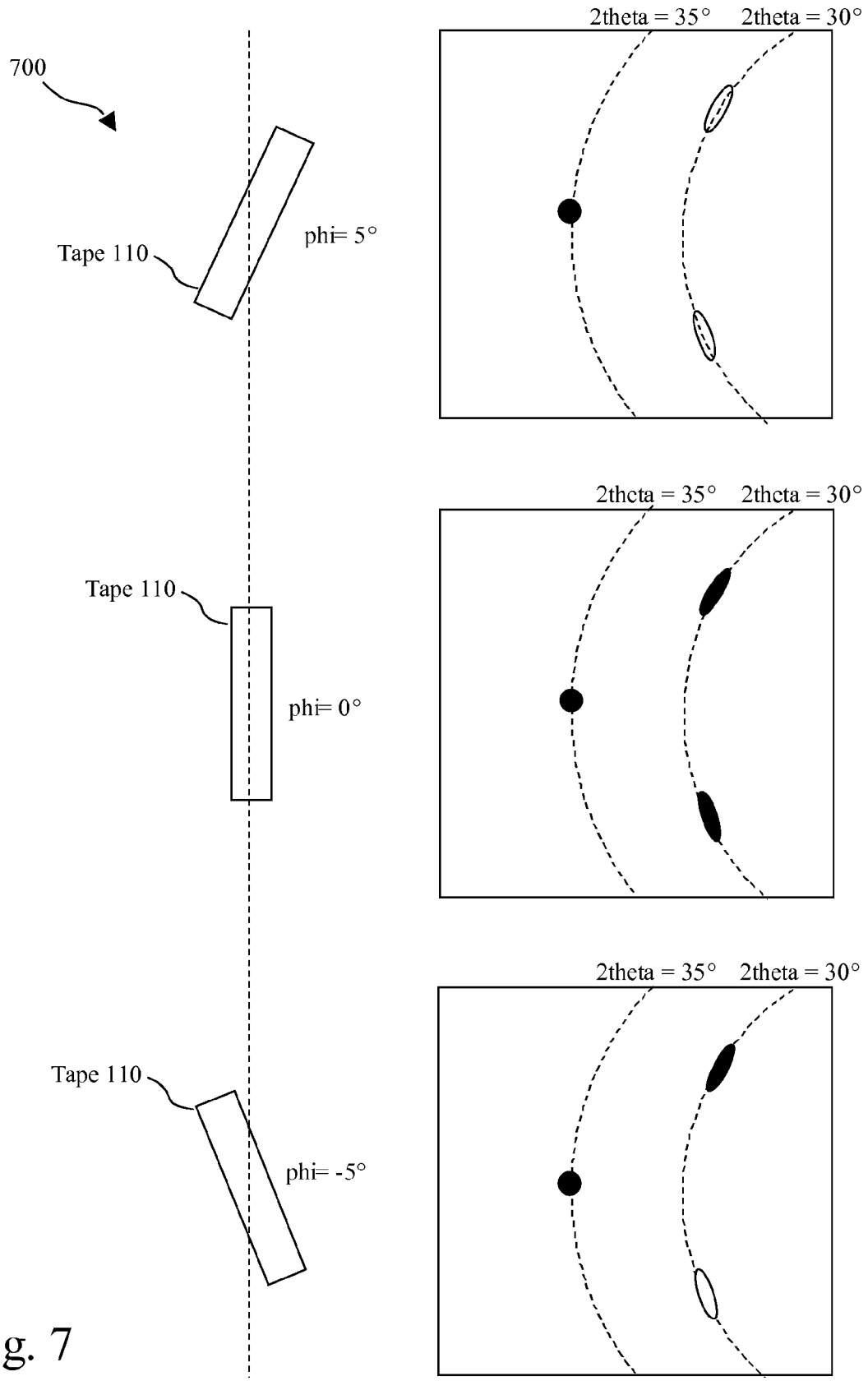
FIG. 7 shows schematic drawings of diffraction patterns made by the XRD system.

FIG. 7 shows a plurality of diffraction patterns 700 that are generated when a signal is created at a specific location in the area detector 142 due to the constructive interference in the diffracted beam 212 that occurs when the Bragg equation is satisfied in conjunction with the regularly repeating crystalline structure of the grains within the thin film atop the tape 110. The Bragg equation relates the angles at which X-rays are scattered by planes with an interplanar spacing (d) and states:

$$n\lambda = 2d \sin \theta$$

where n is an integer, $\lambda$ is the wavelength of incident radiation (constant), d is the interplanar spacing, and $\theta$ is the incident angle of the x-ray beam. In satisfying the Bragg equation, diffraction occurs at a specific $\theta$-angle for each unique set of planes within a particular grain. In the case of YSZ, a diffraction signal recorded at $2\theta = 32.8°$ corresponds to diffraction from the (111) plane and a diffraction signal recorded $2\theta = 34.9°$ corresponds to the (201) plane of YSZ. Of course, such $2\theta$ angles are material specific. With respect to a YBCO superconductor layer a diffraction signal recorded at $2\theta = 32.8°$ corresponds to diffraction from the (103) plane and a diffraction signal recorded $2\theta = 38.5°$ corresponds to the (005) plane.

Information about the orientation of the individual grains that comprise the layer under study is contained in the diffraction patterns 700. Each diffraction pattern corresponds to a different φ-angle, and three φ-angles and their corresponding diffraction patterns 700 are shown in FIG. 7 for illustrative purposes. In practice, it is likely that a diffraction pattern is recorded for each 5° increment between φ=−25° and φ=25°. As a sidenote, when planes are being described, (001) is used to describe one plane and {001} is used to describe a family of planes. When diffraction directions are being described, [001] denotes a direction and <001> denotes a family of directions. For XRD system 100, it is the planes that are doing the diffracting; however, the data in the diffraction pattern is usually described in terms of diffracting directions. Further, the diffraction spot location is denoted as being on a circle of constant 2θ (not θ) in the language of the GADDS software system.

Each constructive interference spot, called a diffraction peak, occurs at a specific location on a specific circle (of varying phi angles) of constant 2θ-angle, where different diffracting planes will produce diffraction peaks at different 2θ angles. In the ideal case, in which all grains are perfectly aligned with respect to one another, the diffraction peaks appear as dots. In the worst case, in which all the grains are randomly oriented with respect to one another, the diffraction peaks appear as solid rings that occur along the curves of constant 2θ-angle. In the typical case, in which there is a substantial degree of in-plane grain misalignment within the thin film, diffraction peaks appear as elongated spots. In the particular case of YSZ, since the grains of the thin film are grown such that the c axis of their unit cells are approximately parallel to each other, the grains are well aligned in the [001] direction and the diffraction peaks appear as dots along the 2θ-angle=35° curve, which corresponds to diffraction by the {001} planes. The diffraction peaks along the 2θ-angle=35° curve remain undiminished in intensity as the tape 110 is rotated through the range of φ-angles away from φ=0° because the c axis of the unit cells does not change relative to the incident beam 210. Further, since there is some degree of in-plane grain misalignment along the [110] direction, the diffraction peaks that occur on the 2θ-angle=30° curve, which corresponds to the {111} planes, appear as elongated spots, and diminish in intensity as the tape 110 is rotated through the range of φ-angles away from φ=0°, because the greatest number of grains is aligned along the [110] direction and fewer and fewer grains occur aligned at greater phi angles, as is illustrated in the three diffraction patterns 700 corresponding to φ=5°, φ=0°, and φ=−5°.

While the (110) plane is the plane of interest to quantify the range of in-plane misalignment that occurs between grains, due to the fact that the [110] direction lies within the plane of the tape 110 and lies parallel to the tape length direction, it is generally difficult to directly obtain diffraction data from the (110) plane. Instead, the {111} set of planes is studied and information, which includes a component that relates information about the {110} set of planes, is extracted.

Figure 8:
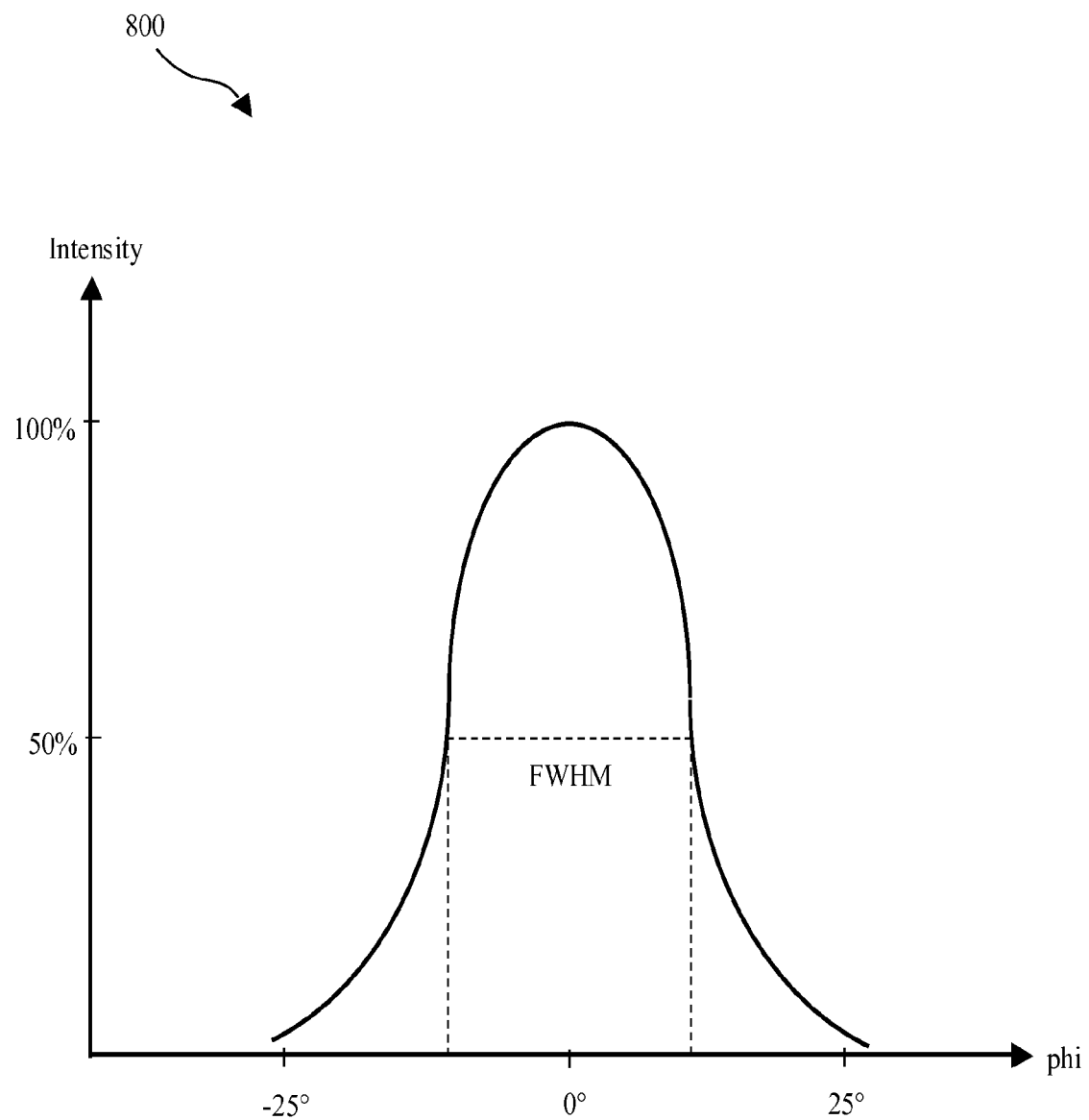
FIG. 8 shows a section of the two-dimensional pole figure that is plotted based on data gathered by the XRD system.

The change in intensity as the tape 110 is rotated in φ is plotted in FIG. 8, which illustrates a section of a two-dimensional pole figure 800 that is analyzed to determine the degree of in-plane grain alignment within the thin film atop the tape 110. From the Gaussian that characterizes the pole figure 800, the full-width at half-max (FWHM) is calculated by controller 144. A large FWHM, and hence a broad peak in the pole figure 800, implies that there is a large range of misorientation in grain alignment along the [110] direction, whereas a small FWHM, and hence a narrow peak in the pole figure 800, implies a high degree of grain alignment along the [110] direction. According to embodiments of the present invention demonstrating grain alignment, typically, the FWHM spread is less than about 30°, most typically not greater than about 20°. Particular embodiments had a FWHM spread of not greater than about 15°, or even 10°.

In the particular case of YSZ, a spread of 15° in the in-plane texture in the YSZ layer ensures that a spread of less than 10° exists in the in-plane texture in the subsequent epitaxially grown YBCO layer, thus enabling desirable a $J_c$ performance, such as on the order of one million amperes/cm² in the finished HTS tape.

It is noted that while the foregoing focuses on characterization of a buffer layer formed at one stage of fabrication of an HTS tape, characterization may be carried out on other layers as well, such as on a textured substrate (as in the case of a RABiT substrate), and most notably, on the superconductor (HTS) layer itself.

Figure 9:
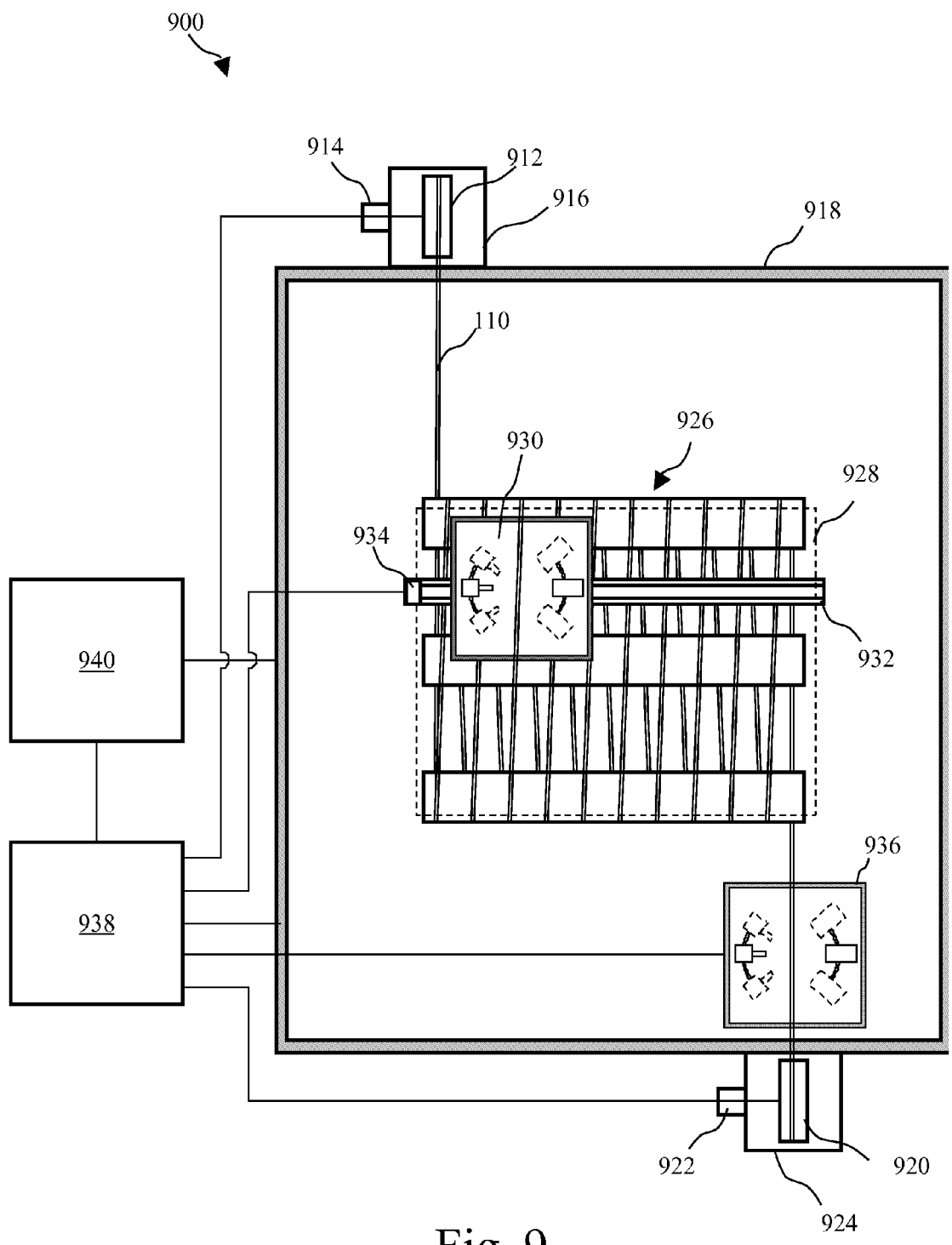
FIG. 9 shows a top view of deposition apparatus that includes an XRD system for determining the crystallographic texture of a reel-to-reel spool-fed continuous tape.
Figure 10:
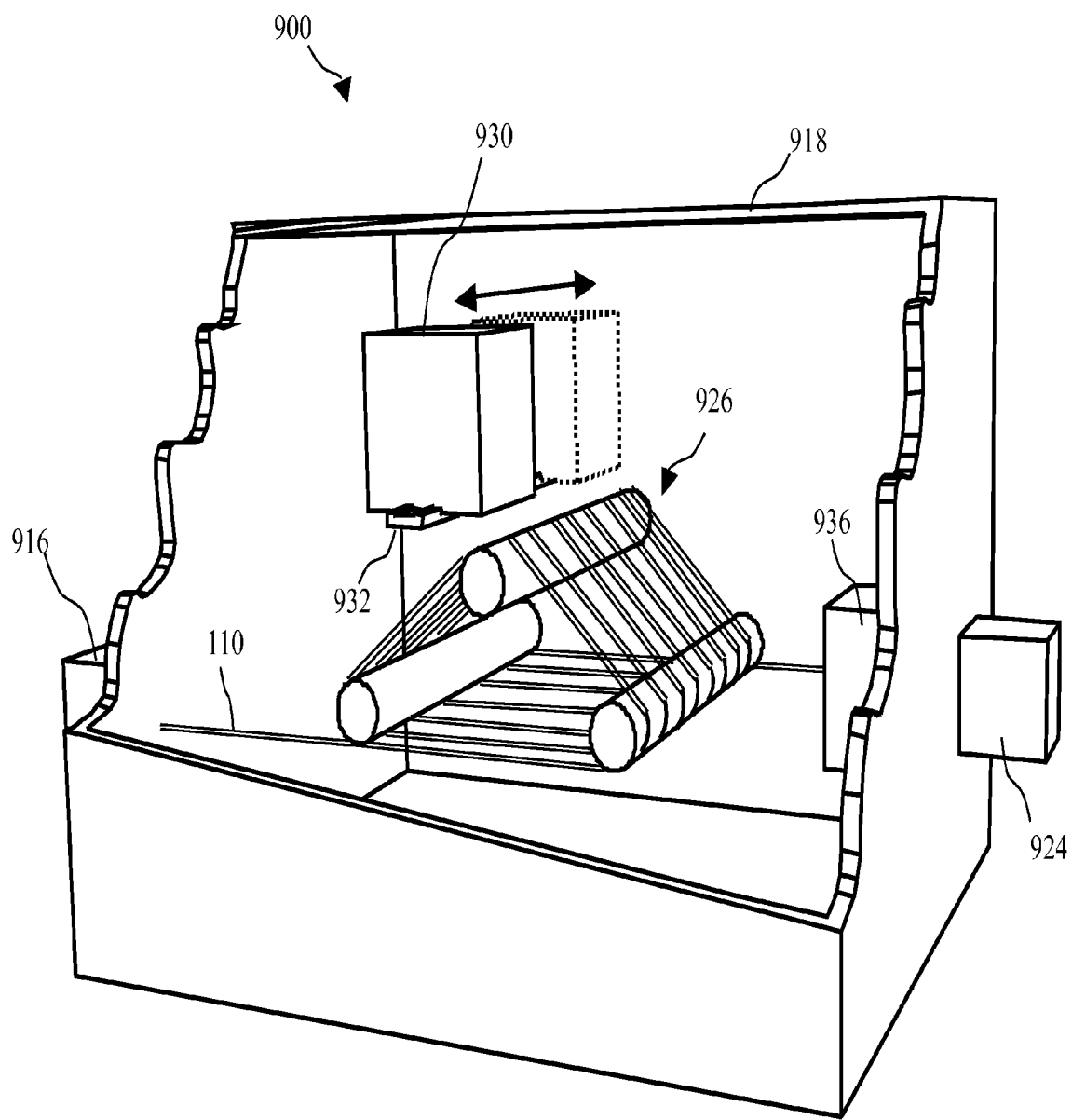
FIG. 10 shows a cutaway perspective view of the deposition system of FIG. 9.

FIG. 9 shows a top view of an HTS processing apparatus 900, notably an ion beam-assisted deposition (IBAD) apparatus, that includes an XRD system for determining the crystallographic texture of a reel-to-reel spool-fed continuous tape. Furthermore, FIG. 10 shows a cutaway perspective view of the apparatus 900. With reference to FIG. 9 and FIG. 10, the apparatus 900 includes a reel-to-reel spool-fed continuous sample in the form of a tape 110, as described above. At least a portion of the buffer layer is typically formed by IBAD, to form a desirable biaxial crystal structure.

The tape 110 unwinds from a payout spool 912 housed in a spool chamber 916 and winds onto a take-up spool 920 housed in a spool chamber 924 in reel-to-reel fashion, translating through a chamber 918 disposed therebetween. A protective interleaf (not shown) may be wound along with the tape 110 onto the take-up spool 920 to protect the coated side of the tape 110. A motor 914 drives the rotation of the payout spool 912 while a motor 922 drives the rotation of the take-up spool 920 as the tape 110 is thereby advanced through the apparatus 900 at a desirable tension. The motors 914 and 922 are commercially available motors such as stepper motors from a vendor such as Oriental Motors.

The chamber 918 may be a pressurized vacuum chamber in which an IBAD process occurs. An opening (not shown) exists between the chamber 918 and the spool chamber 916 having to enable passage of the tape 110. Similarly, an opening (not shown) exists between the chamber 918 and the spool chamber 924. In the case of IBAD processing, chamber 918 houses an IBAD source (not shown) and a tape support assembly 926 arranged with respect to one another so as to optimize performance of the IBAD process that occurs within a deposition zone 928 created therebetween. The IBAD source includes an RF ion source (not shown), as well as other elements well known in the art that are necessary to enable an IBAD process to occur. The tape support assembly 926 is a structure around which the tape 110 helically wraps such that the tape 110 is exposed to the deposition zone 928 a plurality of times. The tape support assembly 926 has a width to accommodate the desired width of the deposition zone 928 that characterizes the IBAD source, and, for example, can measure 15 cm in width to accommodate multiple wraps of the tape 110. The tape support assembly 926 may assume a form similar to that shown in FIG. 1 and FIG. 2 and include an arrangement of rollers around which the tape 110 is made to helically wrap. The tape support assembly 926 may include a cooling plate and is assumed to incorporate all necessary mounting holes and coolant connectors. The tape support assembly 926 further includes a machined shallow helical depression, e.g., one-thousandth of an inch deep, to accommodate the translation of the tape 110 as it slides over the tape support structure 926.

FIG. 9 further illustrates an XRD assembly incorporated in the processing apparatus 900. An XRD assembly 930 is functionally attached to a track 932 such that the XRD assembly 930 translates horizontally through the deposition zone 928. The translation of the XRD assembly 930 is driven by a motor 934, such as a stepper motor commercially available from vendors such as Oriental Motors. The track 932 is available commercially from vendors such as Thomson Industries.

Figure 11:
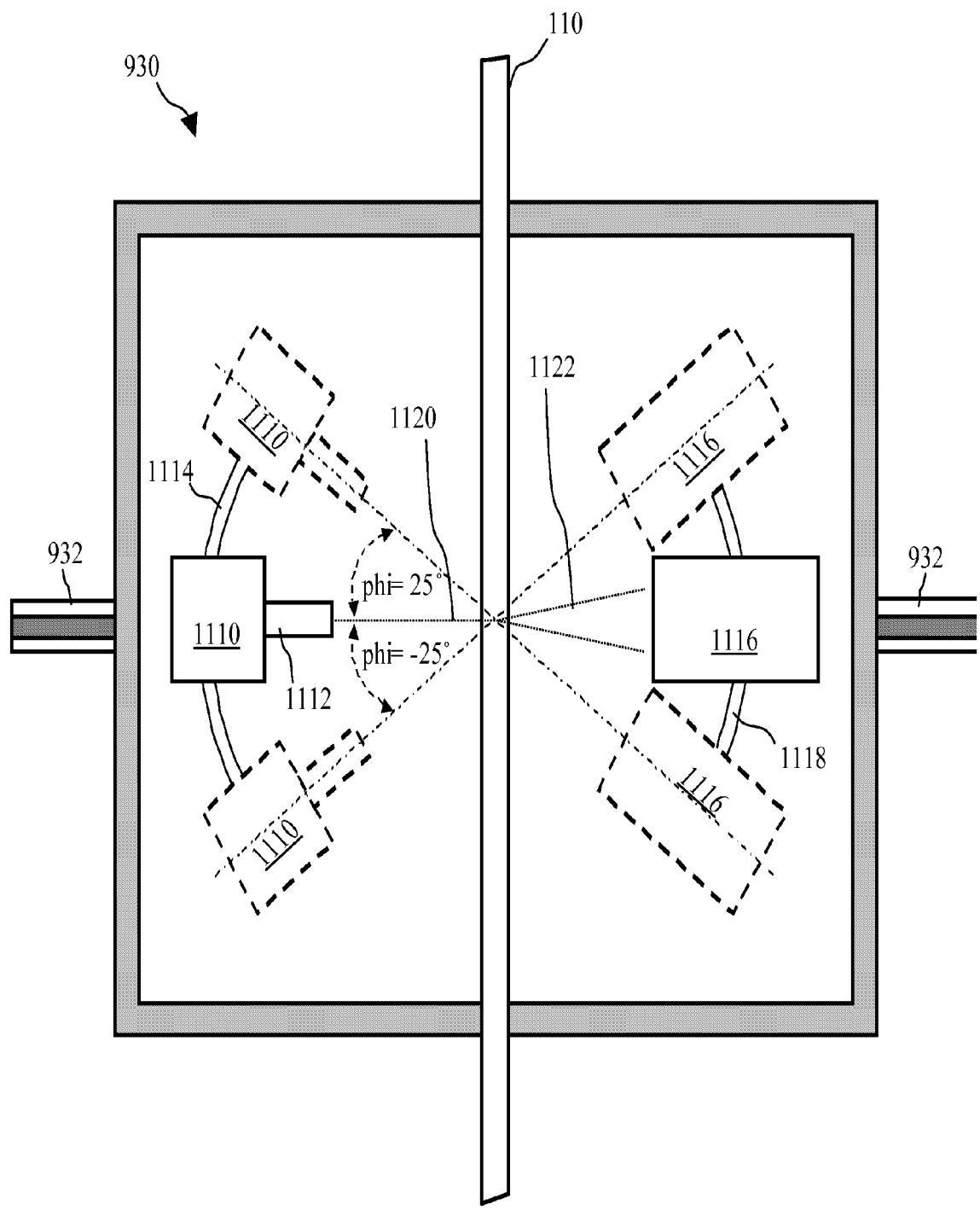
FIG. 11 shows a top view of a rotating XRD assembly.
Figure 12:
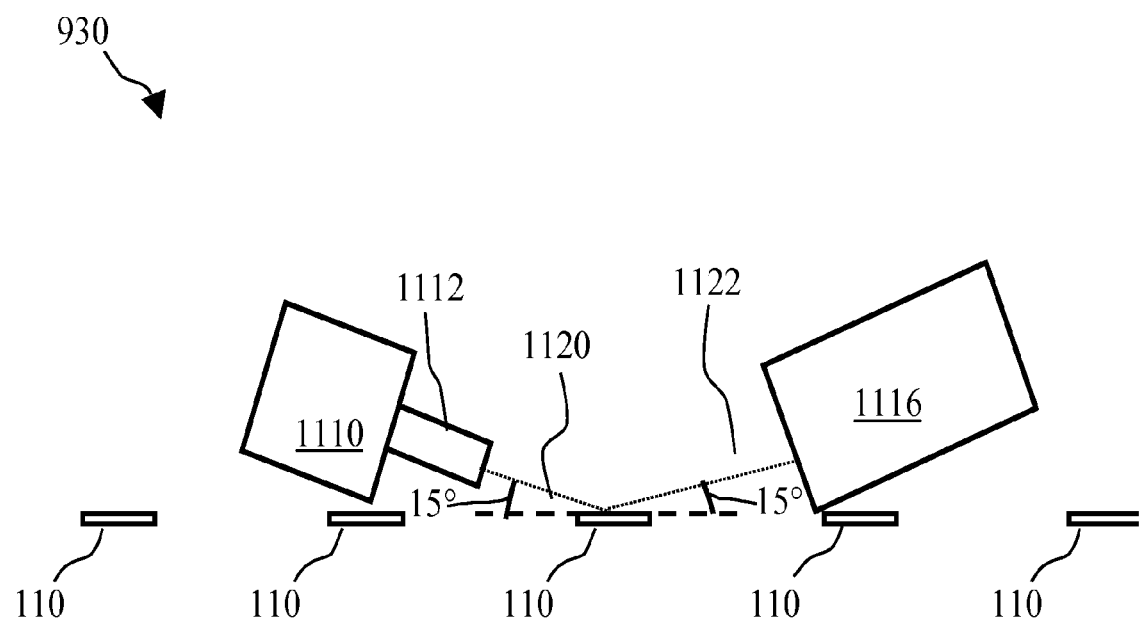
FIG. 12 shows a side view of the rotating XRD assembly.

As shown in detail in FIGS. 11 and 12, the XRD assembly 930 further includes a low-power source 1110 that emits x-ray radiation, which is collimated by an optic 1112 that produces a parallel incident beam 1120 of high intensity, in a similar manner as described above in connection with FIG. 2. The incident beam 1120 interacts with the thin film overlying the tape 110 at an incident angle, which, in the case of YSZ is typically about 15°, to generate a diffracted beam 1122 that is collected at a low-power, high-resolution detector 1116. The source 1110 and the detector 1116 are low power to minimize cooling requirements. The XRD assembly 930 is vacuum compatible, and thus the source 1110, the optic 1112, and the detector 1116 incorporate the appropriate shielding to prevent contamination and deposited species build-up. The source 1110 is functionally attached to a track 1114 and the detector 1116 is functionally attached to a track 1118 such that the motion of the source 1110 and the detector 1116 are coupled together for coupled rotation in $\phi$-space. Coupling may be carried out through physical deployment on a single base that rotates along the tracks 1114 and 1118, or through synchronized coupling electronically. In this regard, the source and detector need not necessarily rotate at the same rate, provided that they are both properly positioned for the targeted phi angle measurement. The track 1114 and the track 1118 are available commercially from vendors such as Thomson Industries.

The apparatus 900 also includes an XRD assembly 936 that is generally similar in form and function to XRD assembly 930, but may remain stationary and generally incorporates no side-to-side translational capability. Like XRD assembly 930, XRD assembly 936 includes an optic 912 and a source 910 whose rotation through $\phi$-space is coupled to a detector 916 along a pair of tracks, i.e., a track 914 and a track 918.

The apparatus 900 further includes a controller 940 and a controller 938. The controller 940 may be embodied as an IBAD system controller to govern the operation of the IBAD process within the chamber 918. The controller 938 is an XRD system controller for controlling the XRD assembly 930 and the XRD assembly 936. The controller 938 is in communication with the controller 940 for the control and measurement of the operation of the apparatus 900. The controller 938 includes a system personal computer utilizing data acquisition and control software such as LabView, and an appropriate set of interfacing components.

In operation, the motor 914 and the motor 922 drive the rotation of the payout spool 912 and the take-up spool 920 and, hence, force the translation of the tape 110 through the chamber 918 at a translational velocity of, for example, between 0.3 meters/hr. and 10 meters/hr. Within the chamber 918, the tape 110 is made to helically moves over the tape support assembly 926 and advance through the deposition zone 928, undergoing a deposition process such as IBAD to form YSZ or MgO films, epitaxial growth of such buffer films, or epitaxial growth of a superconductor layer, such as YBCO. In the case of IBAD, an ion beam bombards the tape 110 at a specific angle as the thin film is being deposited and hinders the growth of grains that are not aligned with the desired orientation. IBAD occurs to the tape 110 until a desired texture is attained.

In-plane texture of the layer under examination is analyzed via the XRD assembly 930 and the XRD assembly 936 as the tape 110 translates in and out of the deposition zone 928, respectively. The motor 934 drives the XRD assembly 930 along the track 932 to a particular wrap of the tape 110 atop the tape support assembly 926, e.g., the third wrap, such that the source 910, the optic 1112, and the detector 1116 are oriented with respect to the tape 110 to perform x-ray diffraction analysis. The optic 1112 collimates x-ray radiation emitted by the source 1110 and produces the parallel incident beam 1120, in contrast to some systems that rely on divergent beams for characterization. In this regard, the parallel x-ray beam is particularly beneficial for use in systems that have the capability of continuous movement of the tape. In such systems, the parallel beam provides improved process control, as z-axis position of the tape (generally vertical direction) can be difficult to precisely control during continuous movement.

The incident beam 1120 interacts with the thin film deposited atop the tape 110 to produce the diffracted beam 1122, which is collected at the detector 1116 and creates a diffraction pattern that is communicated back to the controller 938. Data is collected by the detector 1116 for a time interval of, for example, 0.1 to about 20 seconds (typically 0.1 to about 10 seconds, more typically 1 to about 5 seconds). A coupled rotation through a predetermined $\phi$-angle next occurs between the source 1110 and the detector 1116 along the tracks 1114 and 1118, respectively. The source 1110 then emits x-ray radiation that is collected as the diffracted beam 1122 at the detector 1116 for a similar time interval, and a coupled rotation through another predetermined $\phi$-angle occurs between the source 1110 and the detector 1116 along the tracks 1114 and 1118, respectively. The process continues for a range of phi angles. For example, x-ray diffraction measurements may be performed by the XRD assembly 930 at phi ($\phi$)=0°, $\phi$=−10°, and $\phi$=+10°, although a range of $\phi$-motion is enabled by the assembly between −25° and 25°. At the conclusion of data gathering through the range of $\phi$-angles at a particular wrapping of the tape 110 atop the tape support assembly 926, the controller 938 engages the motor 934, and the XRD assembly 130 advances across the track 932 to a second predetermined wrap of the tape 110 atop the tape support assembly 926, e.g., the fifth wrap, such that the source 1110, the optic 1112, and the detector 1116 are oriented with respect to the tape 110 to perform x-ray diffraction analysis. X-ray diffraction measurements are then performed by the XRD assembly 930 upon the tape 110 along the same segment of the tape 110 upon which x-ray diffraction measurements were performed at the first position of the XRD assembly 930 along the track 932. The process continues a plurality of times, and the XRD assembly 930 performs x-ray diffraction measurements to the same segment of tape 110 a plurality of times as the tape 110 translates across the tape support assembly 926. The in-plane texture information about the layer or film being characterized is analyzed by the controller 938 through the deposition process, and the controller may be manipulated by the detected data for process control. Parameters that may be controlled include tape translation rate (speed), temperature, pressure, gas flow, gas species flow, composition, and combinations thereof.

For example, if a desired texture is achieved atop the tape 110 prior to the last wrap about the tape support assembly 926, and hence, prior to the last translation through the deposition zone 928, the translation of the tape 110 is accelerated. Alternately, if it is found that the desired texture atop the tape 110 is not being achieved by its last translation through the deposition zone 928, the controller 938 accordingly reverses the translation of the tape 110 through the deposition zone 928, decelerates the translation of the tape 110 through the chamber 918, or increases the deposition rate that characterizes the deposition process.

It is noted that while in the foregoing embodiment, the XRD system typically gathers diffraction data through an area of the tape, as a function of translation rate and sampling duration, the tape could be stopped and discrete points on the tape measured. However, continuous data sampling along an area of the tape during continuous movement may be desirable for processing.

As a quality assurance measure, the XRD assembly 936 performs in-plane texture analysis to the tape 110 prior to its exit from the chamber. The XRD assembly 936 performs x-ray diffraction measurements to a segment of the tape 110 through a range of φ-angles in a manner similar to the XRD assembly 930. The controller 938 mathematically interprets the diffraction patterns created at the detector 1116 included in the XRD assembly 130 and at the detector 1116 included within the XRD assembly 936, yielding quantitative information about the texture of the thin film or layer overlying the tape 110. The final output of the controller 938 is in-plane texture as a function of position along the tape 110, as is described in reference to FIG. 13 and FIG. 14.

While the foregoing embodiments generally rely on a single source/detector pair for measuring diffraction data at multiple phi angles, the multiple phi angle data can be gathered through alternative structures. For example, multiple detectors, multiple sources, or a combination of multiple sources and detectors can be utilized. In the case of multiple detectors and sources, they may be disposed as shown by the dotted lines in connection with XRD assemblies 930 and 936. Alternatively, a single source may be used, to be coupled with multiple sources. In this case, the source can have incident beams routed to specific phi angles through use of appropriate optics, thereby forming multiple source points from a single source. However the particularities of the source/detector system are embodied, according to one embodiment, it is generally desirable that the system have the capability of multiple phi angle measurement, which enables calculation of pole figures and derivation of FWHM values for superior characterization of the HTS tape under fabrication or under inspection.

Figure 13:
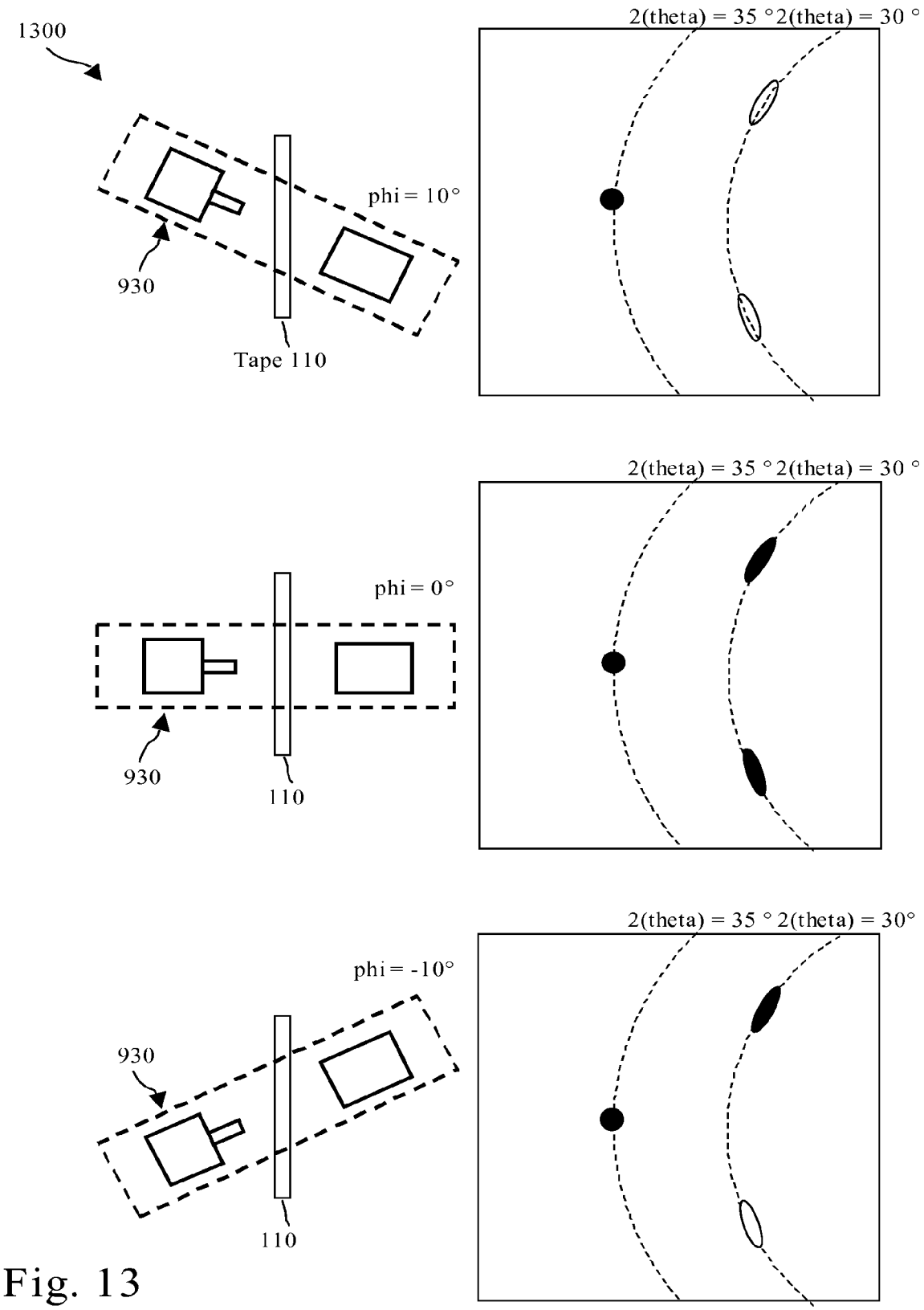
FIG. 13 shows diffraction patterns made by the XRD assemblies.

FIG. 13 shows a plurality of diffraction patterns 1300 that are generated when a signal is created at the detector 1116 due to the constructive interference in the diffracted beam 1122 that occurs when the Bragg equation is satisfied in conjunction with the regularly repeating crystalline structure of the grains within the thin film atop the tape 110, as described in connection with FIG. 7 above.

Figure 14:
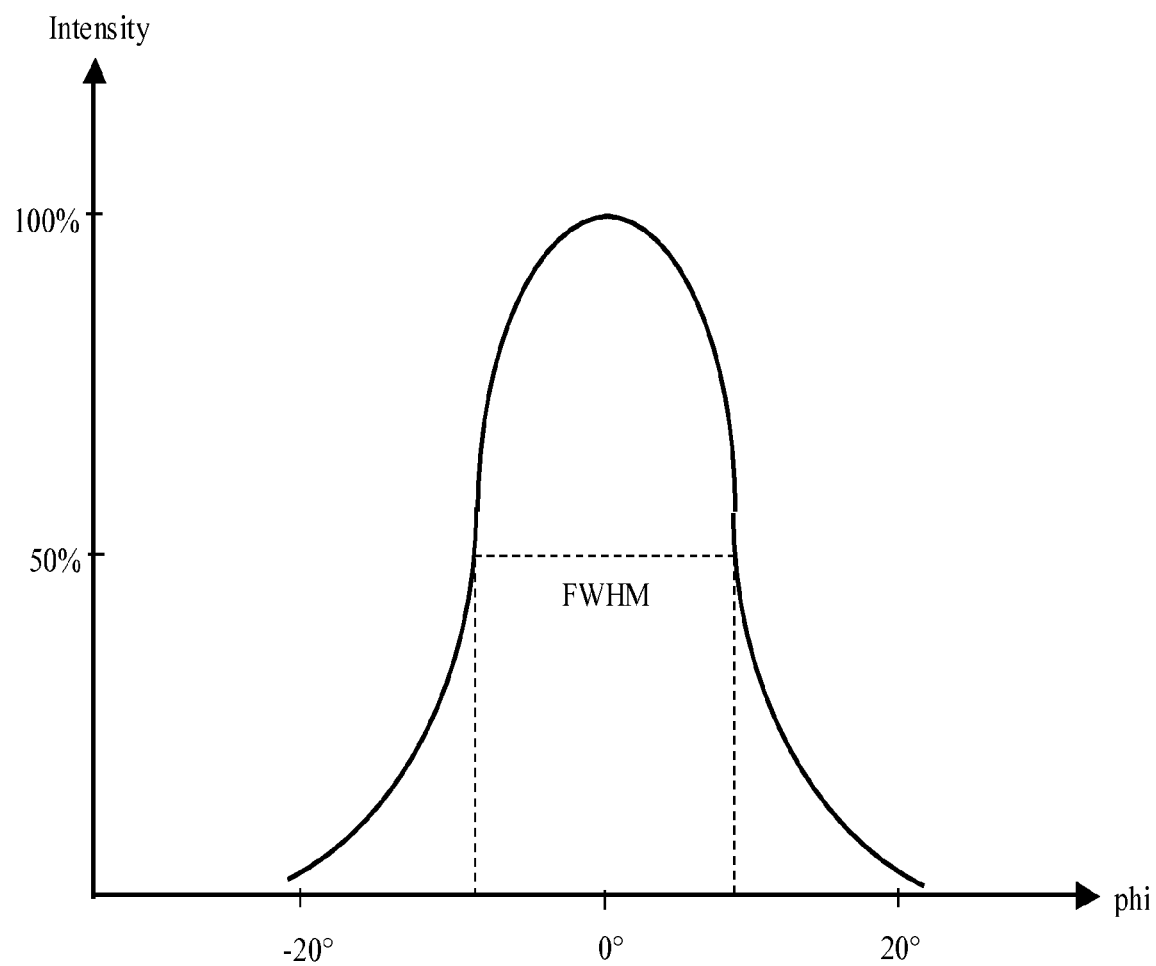
FIG. 14 shows a pole figure that is plotted based on data gathered by the XRD assembly.

FIG. 14 is similar to FIG. 8, illustrating a section of a two-dimensional pole figure 1400 that is analyzed to determine the degree of in-plane grain alignment within the thin film atop the tape 110. A detailed discussion can be found above in connection with FIG. 8. According to embodiments of the present invention, at least one of the substrate, the buffer layer (more specifically at least one buffer film of the buffer layer), and the superconducting layer has a FWHM not greater than about 25°, preferably not greater than 20°, and more preferably not greater than about 15°, or even about 10°. In this regard, assurance of low FWHM values for the substrate and/or the buffer layer are primarily important of assurance of a low FWHM for the superconductor layer, and the actual crystallographic structure and attendant FWHM for the superconductor layer are of particular significance.

As noted above, the embodiment shown in FIGS. 1-6 is readily adapted for ex-situ use, it may be incorporated in-situ as well. Likewise, while the embodiment illustrated in connection with FIGS. 9-12 is particular adapted for in-situ use (such as in a processing chamber, including IBAD processing chambers and HTS deposition chambers), it may be embodied to be an ex-situ system, such as a tabletop system.

While the foregoing description generally describes use of XRD characterization in connection with various layers (e.g., substrate, buffer layer, superconductor layer), certain embodiments do not utilize textured substrates, such as a randomly oriented polycrystalline alloy substrates, and accordingly, XRD characterization is not carried out in connection therewith. Further, it is generally most desirable to utilized the present XRD techniques in connection with the superconductor layer, since this layer is vitally important to the functionality of the conductor, and the devices incorporating same, such as power cables, transformers, generators, and other power equipment.

While it should be generally apparent that the foregoing embodiments provide novel formation and characterization techniques in connection with HTS conductors, it is also emphasized that embodiments also enable superior quality control features in addition to process control. For example, characterization data, most notably data in connection with the superconductor layer, may be attributed to a particular conductor. This association of data can be used by the conductor manufacturer for cataloguing and/or grading of conductors, and can be provided to the customer. Additional details regarding X-ray diffraction components that may be utilized to carry out embodiments of the present invention may be found in U.S. 60/489,047, filed Jul. 22, 2003, incorporated herein by reference.

What is claimed is:

1. A method of forming a superconductive article, comprising the steps of:
    providing a substrate, the substrate having an aspect ratio of not less than about $1 \times 10^3$;
    forming a buffer layer overlying the substrate;
    forming a superconductor layer overlying the buffer layer; and
    characterizing the in-plane texture of at least one of the substrate, the buffer layer and the superconductor layer by x-ray diffraction, wherein x-ray diffraction data are taken at multiple phi angles, wherein a number of the multiple phi angles taken are between 3 and 25 and the phi angles range from −25° to 25°.

2. The method of claim 1, wherein characterizing is carried out utilizing an x-ray diffraction apparatus, the apparatus comprising an x-ray source and an x-ray detector, wherein x-rays are directed and detected at multiple angles corresponding to the multiple phi angles.

3. The method of claim 2, wherein the substrate and the source and detector are re-positioned relative to each other at said multiple angles corresponding to the multiple phi angles, such that characterizing can be carried out at said multiple phi angles.

4. The method of claim 3, wherein the source and the detector are rotated relative to the substrate.

5. The method of claim 4, wherein the source and the detector are coupled together for coordinated rotation for characterization at said multiple phi angles.

6. The method of claim 3, wherein the substrate is rotated relative to the x-ray source and x-ray detector.

7. The method of claim 2, wherein multiple x-ray sources are provided for characterization at said multiple phi angles.

8. The method of claim 1, wherein diffraction data are taken at three unique phi angles.

9. The method of claim 1, wherein diffraction data are taken at not fewer than four unique phi angles.

10. The method of claim 1, wherein diffraction data are taken at not greater than twenty phi angles.

11. The method of claim 1, wherein the detector detects diffracted x-rays from the superconductive article, to provide a pole figure representation of crystal structure of the at least one of the substrate, the buffer layer and the superconductor layer subjected characterization.

12. The method of claim 11, wherein the pole figure represents the crystal alignment, and a full width half maximum value is calculated from the pole figure for crystal alignment quantification.

13. The method of claim 12, wherein the at least one of the substrate, buffer layer, and superconductor layer has a crystal structure having a full width half maximum not greater than about 30°.

14. The method of claim 13, wherein the full width half maximum is not greater than about 20°.

15. The method of claim 13, wherein the full width half maximum is not greater than about 10°.

16. The method of claim 13, wherein the superconductor layer has said full width half maximum value not greater than 20.

17. The method of claim 1, wherein characterizing is carried out at discrete positions along a length of the article, and the substrate is in a fixed position during characterizing.

18. The method of claim 1, wherein characterizing is carried out continuously along a length of the article, and the substrate continuously moves along its length direction during characterizing.

19. The method of claim 1, wherein the article is in the form of a tape, linearly passing through a characterizing zone in which the x-ray diffraction apparatus is disposed, the tape being routed through the zone by a reel-to-reel apparatus.

20. The method of claim 1, wherein characterizing is carried out on the superconductive layer.

* * * * *